(12) United States Patent
Haug

(10) Patent No.: US 9,244,128 B2
(45) Date of Patent: Jan. 26, 2016

(54) DEEP-DISCHARGE PROTECTION METHOD AND MOTOR VEHICLE

(71) Applicants: Robert Bosch GmbH, Stuttgart (DE); Samsung SDI Co., Ltd., Yongin-si, Gyeonggi-do (KR)

(72) Inventor: Karsten Haug, Stuttgart (DE)

(73) Assignee: Robert Bosch GmbH, Stuttgart (DE)

(*) Notice: Subject to any disclaimer, the term of this patent is extended or adjusted under 35 U.S.C. 154(b) by 160 days.

(21) Appl. No.: 13/965,089

(22) Filed: Aug. 12, 2013

(65) Prior Publication Data

US 2014/0042965 A1 Feb. 13, 2014

(30) Foreign Application Priority Data

Aug. 13, 2012 (DE) .......................... 10 2012 214 358

(51) Int. Cl.
*H02J 7/00* (2006.01)
*G01R 31/36* (2006.01)
*B60L 11/18* (2006.01)
*H02J 7/14* (2006.01)

(52) U.S. Cl.
CPC ......... *G01R 31/3606* (2013.01); *B60L 11/1859* (2013.01); *H02J 7/0029* (2013.01); *H02J 7/1461* (2013.01); *H02J 2007/004* (2013.01); *Y02T 10/7005* (2013.01); *Y02T 10/705* (2013.01); *Y02T 10/7011* (2013.01); *Y02T 90/16* (2013.01)

(58) Field of Classification Search
CPC .. Y02T 90/14; Y02T 90/128; H05B 33/0842; H02J 9/02; H02J 9/065; H02J 7/025; H02J 3/38; H02J 7/0004; H02J 7/0008; H02J 7/008; H02J 7/163; H02J 9/061; H02J 13/0003; H02J 13/0079; H02J 13/00
USPC ................................................... 320/106–112
See application file for complete search history.

(56) References Cited

U.S. PATENT DOCUMENTS

| 5,521,443 | A | 5/1996 | Imura et al. |
| 7,813,769 | B2 | 10/2010 | Sakai |
| 2005/0077867 | A1* | 4/2005 | Cawthorne et al. ........... 320/104 |
| 2008/0088422 | A1 | 4/2008 | Sakai |
| 2009/0066291 | A1* | 3/2009 | Tien et al. ..................... 320/118 |
| 2010/0256859 | A1 | 10/2010 | Leyerle et al. |

FOREIGN PATENT DOCUMENTS

CN 1713478 A 12/2005

OTHER PUBLICATIONS

Centers for Disease Control, "Carbon Monoxide Hazards from Small Gasoline Powered Engines," NIOSH Workplace Safety and Health Topic, Jun. 5, 2012 (4 pages).

* cited by examiner

*Primary Examiner* — Binh Tat
(74) *Attorney, Agent, or Firm* — Maginot, Moore & Beck LLP

(57) ABSTRACT

A deep-discharge protection method for protecting a battery of a parking motor vehicle is shown. In this case, a state of charge of the battery is regularly monitored by a battery control unit and is transmitted to an evaluation unit. When a predefined state of charge of the battery is reached, a message is transmitted from a communication unit to a stored address by mobile radio and/or information acquired using a sensor system is used by the evaluation unit to determine whether a situation of the motor vehicle is suitable for autonomous recharging of the battery.

7 Claims, 1 Drawing Sheet

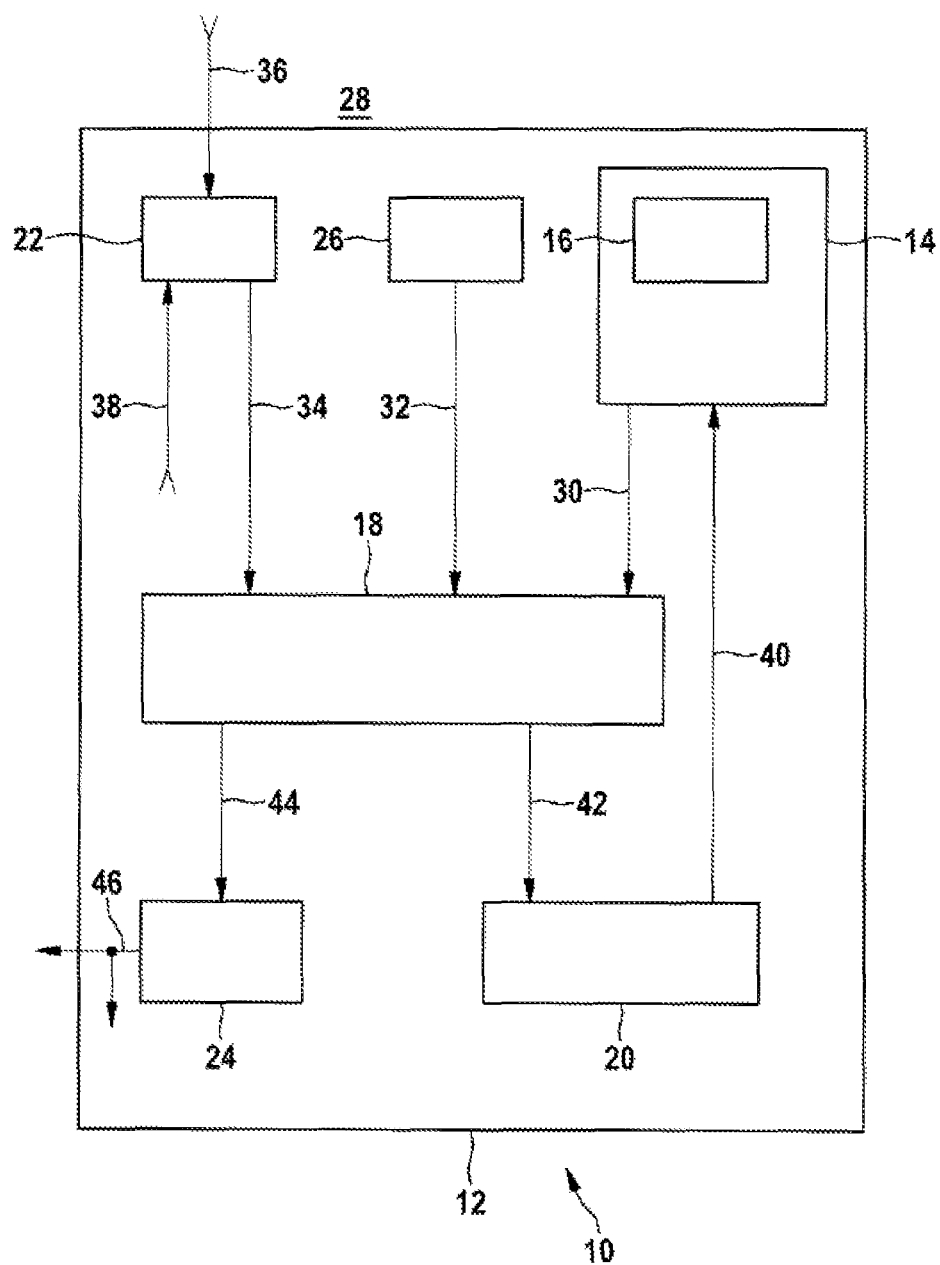

DEEP-DISCHARGE PROTECTION METHOD AND MOTOR VEHICLE

This application claims priority under 35 U.S.C. §119 to patent application no. DE 10 2012 214 358.0, filed on Aug. 13, 2012 in Germany, the disclosure of which is incorporated herein by reference in its entirety.

BACKGROUND

The present disclosure relates to a deep-discharge protection method for protecting a battery of a motor vehicle from an irreversible deep discharge.

Protection methods and apparatuses relating to motor vehicles are known in various configurations. Methods and apparatuses for theft protection, for accident protection, for occupant protection or for protecting a wide variety of the vehicle's own units are used, for example.

It is also known practice to transmit information relating to particular vehicle states using wireless means of communication in such methods. US 2010/0256859 A1, for example, shows a method for transmitting notifications of abnormal vehicle states. US 2008/0088422 A1 discloses an anti-theft alarm system which transmits warning messages on the basis of the battery state. In addition, U.S. Pat. No. 5,521,443 A shows a portable display apparatus for monitoring the residual capacity of a vehicle battery.

A trend in the motor vehicle industry is the use of batteries as traction batteries, in particular the use of lithium ion batteries. In such systems, a discharge below a particular level is harmful to the battery and may result in irreversible defects.

SUMMARY

A deep-discharge protection method and a motor vehicle are proposed. Advantageous developments of the disclosure are stated in the subclaims and are described in the description.

A deep-discharge protection method for protecting a battery of a parking motor vehicle is proposed. In this case, a state of charge of the battery is regularly monitored by a battery control unit and is transmitted to an evaluation unit. According to the disclosure, when a predefined state of charge of the battery is reached, a message is transmitted from a communication unit to a stored address by mobile radio and/or information acquired using a sensor system is used by the evaluation unit to determine whether a situation of the motor vehicle is suitable for autonomous recharging of the battery.

This advantageously makes it possible to inform of a deep discharge of the battery of the motor vehicle and/or to prepare for autonomous recharging even if no-one able to initiate countermeasures, such as the connection to a charging station, is in the vicinity of the motor vehicle. The transmission of a message by mobile radio advantageously enables communication over very large distances. In addition, this system can be used to provide servicing services which initiate countermeasures for the vehicle owner.

One particular refinement of the deep-discharge protection method according to the disclosure provides for recharging of the battery by means of a generator to be initiated by the evaluation unit if it is determined that the situation is suitable.

The battery of the motor vehicle can thus be advantageously recharged autonomously, without intervention from the outside, at least if the situation permits this. Expensive damage to the battery and operational failure of the motor vehicle are thus avoided.

Another particular refinement of the deep-discharge protection method according to the disclosure provides for information acquired by a rain sensor of the sensor system to be concomitantly taken into account by the evaluation unit.

Instead of the rain sensor or in addition to the rain sensor, another particular refinement of the deep-discharge protection method according to the disclosure provides for information acquired by a light sensor of the sensor system to be concomitantly taken into account by the evaluation unit.

Instead of or in addition to the previously mentioned sensors, another particular refinement of the deep-discharge protection method according to the disclosure provides for information acquired by distance sensors of the sensor system to be concomitantly taken into account by the evaluation unit.

Instead of or in addition to the previously mentioned sensors, another particular refinement of the deep-discharge protection method according to the disclosure provides for information acquired by a video sensor of the sensor system to be concomitantly taken into account by the evaluation unit.

All of the sensors mentioned in the various refinements each advantageously provide an indication of whether the motor vehicle is outside, in particular as early as before the battery is recharged with $CO_2$-generating means. In combinations they provide the evaluation unit with a result which is still reliable. In addition, said sensors are already present in many vehicle series, with the result that it is possible to dispense with additional hardware when carrying out the method according to the disclosure in its various refinements. The evaluation unit can access the information determined for other functions in the vehicle by the sensors which are already present. The method can therefore be adapted depending on the vehicle series.

Instead of or in addition to the previously mentioned sensors, another particular refinement of the deep-discharge protection method according to the disclosure provides for information acquired by a seat occupancy sensor of the sensor system to be concomitantly taken into account by the evaluation unit.

This advantageously makes it possible not only to take into account the situation in the environment of the motor vehicle but also to obtain an indication of whether there is a person in the motor vehicle. A message can then be advantageously emitted into a passenger compartment of the motor vehicle if seat occupancy is detected by the seat occupancy sensor.

Another particular refinement of the deep-discharge protection method according to the disclosure provides for a $CO_2$ sensor of the sensor system to regularly check a $CO_2$ content of an environment during recharging of the battery.

A further check which is also redundant is therefore provided for protection. Since an increased $CO_2$ content is the value which can ultimately result in personal injury, a direct check of the $CO_2$ content is the most reliable method for precluding personal injury.

The disclosure also proposes a motor vehicle at least having a battery, a battery control unit and an evaluation unit, which motor vehicle is suitable for carrying out the deep-discharge protection method according to the disclosure. In this case, the battery of the motor vehicle is preferably a lithium ion battery.

According to the disclosure, the term battery also comprises battery systems, accumulator batteries, accumulators, accumulator systems, in particular lithium ion systems or lithium polymer ion systems.

BRIEF DESCRIPTION OF THE DRAWING

Exemplary embodiments of the disclosure are explained in more detail using the drawing and the following description. In the drawing:

The FIGURE shows a schematic basic diagram of a deep-discharge protection method according to the disclosure in a motor vehicle according to the disclosure.

DETAILED DESCRIPTION

The FIGURE outlines an exemplary refinement of the principle of a deep-discharge protection method 10 according to the disclosure in a motor vehicle 12 according to the disclosure having a battery 14.

According to the disclosure, the motor vehicle 12 is preferably an electric vehicle (EV), a hybrid vehicle (HEV), a plug-in hybrid vehicle (PHEV) and/or a vehicle provided with a range extender (REX). For this purpose, the battery 14 of the motor vehicle 12 is preferably designed as a traction battery. The battery 14 is a lithium ion battery, in particular. The deep-discharge protection method 10 according to the disclosure is used to protect the battery 14 from a deep discharge.

In order to carry out the deep-discharge protection method 12 according to the disclosure, the motor vehicle 12 comprises at least one battery control unit 16 and an evaluation unit 18. According to the disclosure, the motor vehicle 12 may also have a communication module 24, a global positioning system module (GPS module) 26, a sensor system 22 and a generator 20 (except for the EV).

In a first step of the deep-discharge protection method 10 according to the disclosure, the battery 14 is regularly monitored by the battery control unit 16. The battery control unit 16 provides the evaluation unit 18 with charging status information 30.

If the charging status of the battery 14 undershoots a predefined level, for example 5 percent of the charging capacity of the battery 14, the evaluation unit 18, in a next step of the deep-discharge protection method 10 according to the disclosure, either initiates the transmission of a message 46 by virtue of the evaluation unit 18 providing the communication unit 24 with a communication command 44, and/or the evaluation unit 18 evaluates situation data 34 obtained from the sensor system 22 in order to check whether a current situation of the motor vehicle 12 allows the battery 14 to be autonomously recharged 40 with electrical energy using the vehicle's own generator 20.

In order to transmit the message 46, the communication module 24 has a transmitter, preferably a mobile radio transmitter, which masters the GSM (Global System for Mobile Communications), EDGE (Enhanced Data Rates for GSM Evolution), GPRS (General Packet Radio Service), HSCSD (High Speed Circuit Switched Data), UMTS (Universal Mobile Telecommunications System) and/or HSDPA (High Speed Downlink Packet Access) standards, for example. In addition, the communication module 24 has a memory which stores at least an address, in particular a telephone number and/or an email address, to which the message 46 is transmitted.

The message 46 is used to inform the owner of the motor vehicle 12 and/or an entrusted servicing service of the critical charging status 30 of the battery 14 of the motor vehicle 12. They in turn can now counteract further discharging of the battery 14 by means of appropriate actions. According to the disclosure, a plurality of messages 46 may also be transmitted from the communication unit 24, for example on the basis of whether no countermeasure has been initiated after a particular time limit.

The message 46 is, in particular, an SMS (Short Message Service) and/or a voice message and/or an email. For example, the message 46 contains the information relating to how many days presumably remain until an irreversible deep discharge of the battery 14 occurs if the situation is unchanged. In particular, if the message 46 is delivered to a servicing service, the message 46 may additionally contain, according to the disclosure, position data 32 for the motor vehicle 12. The evaluation unit 18 receives the position data 32 from the GPS module 26. The recipient of the message 46 is therefore simultaneously informed of the location at which the motor vehicle 12 is currently located.

The sending of the message 46 is obligatory for the motor vehicle 12 according to the disclosure if it is an electric vehicle. If the motor vehicle 12 according to the disclosure is a hybrid vehicle, a plug-in hybrid vehicle and/or a vehicle provided with a range extender, the sending of the message 46 is optional.

If the motor vehicle 12 according to the disclosure is a hybrid vehicle, a plug-in hybrid vehicle and/or a vehicle provided with a range extender, it has a generator 20 which can generate electrical energy. The motor vehicle 12 therefore has a device for recharging 40 the battery 14. The generator 20 is, in particular, an apparatus consisting of an internal combustion engine and a generator.

As an alternative to sending the message 46 by means of the communication module 24 or else after a particular time limit after the message 46 has been sent and after a charging status situation which is still critical or if it is impossible to send the message 46, for example because the motor vehicle 12 is in a radio gap, the evaluation unit 18 checks a current situation of the motor vehicle 12 in order to determine whether it is possible to harmlessly recharge 40 the battery 14. For this purpose, the motor vehicle 12 according to the disclosure preferably has the sensor system 22.

According to the disclosure, the sensor system 22 determines environmental information 36 from a direct environment 28 of the motor vehicle 12. According to the disclosure, the sensor system 22 may also determine passenger compartment information 38 relating to the motor vehicle 12.

The evaluation unit 18 determines, in particular, whether the motor vehicle 12 is in a closed space. In the closed space, the operation of the generator 20 could result in poisoning of people in the space since the internal combustion engine of the generator 20 emits $CO_2$.

In order to check whether the motor vehicle 12 is in a space in which the operation of the generator 20 and thus the autonomous recharging 40 of the battery 14 is harmless, there are a plurality of different methods according to the disclosure which are used individually or in combinations with one another according to the disclosure.

For one variant according to the disclosure, the motor vehicle 12 according to the disclosure comprises a light sensor or a light/rain sensor or a rain sensor. Such sensors are already provided in many vehicle models in order to automatically operate vehicle lighting or windscreen wipers. If rain is detected using the rain sensor, this is an indication that the motor vehicle 12 is outside. This may be combined with an analysis of the ambient light from above. If the motor vehicle 12 is outside, the brightness will change over the course of the day according to the position of the sun. For this purpose, the evaluation unit 18 preferably takes into account the time of day. Inclusion of the date and the position data 32 is also conceivable according to the disclosure in order to compare whether the brightness over the course of the day corresponds to the usual brightness at this location and at this time of year. Corresponding comparison values are stored in the evaluation unit 18 for this purpose. The same maximum brightness as in the open air generally cannot be achieved in a garage. A combination of the light and rain values increases the detector reliability.

For another variant according to the disclosure, the sensor system 22 of the motor vehicle 12 comprises distance sensors. Such sensors are already provided in vehicles, for example for parking assistance or to keep a distance. The distance sensors may be radar and/or lidar sensors. The distance sensors allow a distinction to be made between spacious underground garages with a large volume of air and narrow single garages with a small volume of air. The greater the volume of air, the less problematic the operation of an internal combustion engine with respect to the $CO_2$ concentration. In addition, large underground garages usually have ventilation which ensures a supply of fresh air.

In a single garage, a distance to the rear, to the front left and/or to the front right is typically small, that is to say less than 1 m. These distances are directly measured using the distance sensors. In a public underground garage, at least the distance to the front or rear, depending on whether the vehicle was driven or reversed into the parking space, is considerably greater than 1 m.

For further variants according to the disclosure, the sensor system 22 of the motor vehicle 12 has video sensors. Information from the environment 28 or else passenger compartment information 38 from the motor vehicle 12 is recorded using the video sensors, is transmitted 34 to the evaluation unit 18 and is evaluated by the evaluation unit 18 using image processing algorithms, for example by means of pattern matching, or else using the brightness profile. It is thus possible to determine from the environmental information 36 whether the motor vehicle 12 is outside or is in a closed space. The passenger compartment information 38 can be used to determine whether there is a person in the motor vehicle 12.

For this purpose or instead of this, the sensor system 22 of the motor vehicle 12 according to the disclosure may also comprise further passenger compartment sensors for determining passenger compartment information 38. Motion sensors of an alarm system or seat occupancy sensors of an occupant safety system can be used to determine whether there is a person in the motor vehicle 12. In this case, the message 46 is alternatively or additionally output into the passenger compartment of the motor vehicle 12, acoustically or visually with suitable means. According to the disclosure, the message 46 is preferably always additionally output into the passenger compartment.

If the evaluation unit 18 determined, according to one or more of said methods, that it is possible to harmlessly autonomously recharge 40 the battery 14 on the basis of the current situation of the motor vehicle 12, the evaluation unit 18 provides the generator 20 with a charging command 42, which generator then supplies the battery 14 with electrical energy. The battery 14 is therefore recharged 40 until a predefined state of charge is reached, for example 5% of the charging capacity of the battery 14.

During the charging operation, the $CO_2$ content of the air in the immediate environment 28 of the motor vehicle 12 is preferably determined according to the disclosure. In spaces which are too small or poorly ventilated, the $CO_2$ content quickly increases if an internal combustion engine is operated. For this purpose, the sensor system 22 of the motor vehicle 12 preferably has a $CO_2$ sensor. The latter is, in particular, the climate control sensor (CCS) which is already present in an air-conditioning system of the motor vehicle 12. So that the air can pass from the environment 28 to the $CO_2$ sensor, at least one window of the motor vehicle 12 is opened slightly, initiated by the evaluation unit, or a fresh-air valve of the ventilation system is opened and air is sucked in from the environment 28 by means of a fan. The $CO_2$ content of the air is now measured. If the $CO_2$ content of the air increases considerably over the time during which the generator 20 is operated, this is an indication that the motor vehicle 12 is not outside or is not in a well-ventilated space. In this case, the autonomous recharging 40 of the battery 14 by means of the generator 20 is aborted. For this purpose, the evaluation unit 18 stores threshold values, the exceeding of which could harm people.

What is claimed is:

1. A deep-discharge protection method for protecting a battery of a parked motor vehicle, comprising:

regularly monitoring a state of charge of the battery with a battery control unit;

transmitting the state of charge of the battery to an evaluation unit receiving with the evaluation unit sensor data corresponding to an environment around the motor vehicle from a sensor system associated with the motor vehicle;

initiating, with the evaluation unit, recharging of the battery by a generator in response to the sensor data indicating that the vehicle is in an outdoor location; and when a predefined state of charge of the battery is reached, transmitting with a mobile radio a message from a communication unit to another electronic device that is not operatively connected to the battery with reference to a stored address of the other electronic device to inform a user of the electronic device of the state of charge of the battery.

2. The deep-discharge protection method according to of claim 1, further comprising:

receiving with the evaluation unit sensor data corresponding to rain in the environment around the vehicle;

identifying with the evaluation unit that the motor vehicle is in the outdoor location at least in part in response to the sensor data; and operating an internal combustion engine in the motor vehicle to recharge the battery in response to the identification that the motor vehicle is in the outdoor location.

3. The deep-discharge protection method according to of claim 1, further comprising:

receiving with the evaluation unit sensor data corresponding to light in the environment around the vehicle;

identifying with the evaluation unit that the motor vehicle is in the outdoor location at least in part in response to the sensor data; and operating an internal combustion engine in the motor vehicle to recharge the battery in response to the identification that the motor vehicle is in the outdoor location.

4. The deep-discharge protection method of claim 1, further comprising:

receiving with the evaluation unit sensor object distance data corresponding to corresponding to distances between the vehicle and one or more objects in the environment around the vehicle;

identifying with the evaluation unit that the motor vehicle is in the outdoor location at least in part in response to the sensor object distance data; and operating an internal combustion engine in the motor vehicle to recharge the battery in response to the identification that the motor vehicle is in the outdoor location.

5. The deep-discharge protection method according to of claim 1, further comprising:
   receiving with the evaluation unit sensor data distances data corresponding to distances between the vehicle and one or more objects in the environment around the vehicle;
   identifying with the evaluation unit that the motor vehicle is in the outdoor location at least in part in response to the sensor data; and
   operating an internal combustion engine in the motor vehicle to recharge the battery in response to the identification that the motor vehicle is in the outdoor location.

6. The deep-discharge protection method according to of claim 3, further comprising:
   receiving with the evaluation unit the sensor data corresponding to light in the environment around the vehicle from a video sensor in the sensor system; and
   identifying with the evaluation unit that the motor vehicle is in the outdoor location in response to a light level in the sensor data from the video sensor exceeding a predetermined threshold.

7. A motor vehicle comprising:
   a battery;
   a battery control unit operatively connected to the battery;
   a mobile radio a sensor system; and
   an evaluation unit receive evaluation unit sensor data corresponding to an environment around the motor vehicle from the sensor system;
   initiate recharging of the battery by a generator in response to the sensor data indicating that the vehicle is in an outdoor location operatively connected to the battery control unit, the mobile radio, and the sensor system, the evaluation unit being configured to:
   monitor a state of charge of the battery with the battery control unit; and
   transmit with the mobile radio a message from a communication unit to another electronic device that is not operatively connected to the battery with reference to a stored address of the electronic device to inform a user of the electronic device of the state of charge of the battery.

* * * * *